(12) United States Patent
Minamitani et al.

(10) Patent No.: US 7,589,527 B2
(45) Date of Patent: Sep. 15, 2009

(54) ELONGATED MAGNETIC SENSOR

(75) Inventors: Tamotsu Minamitani, Hakusan (JP); Masaya Ueda, Hakusan (JP); Koji Shinmura, Kanazawa (JP); Masanaga Nishikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 642 days.

(21) Appl. No.: 10/595,407

(22) PCT Filed: Mar. 7, 2005

(86) PCT No.: PCT/JP2005/003843

§ 371 (c)(1),
(2), (4) Date: Apr. 14, 2006

(87) PCT Pub. No.: WO2005/091008

PCT Pub. Date: Sep. 29, 2005

(65) Prior Publication Data

US 2009/0146656 A1 Jun. 11, 2009

(30) Foreign Application Priority Data

Mar. 23, 2004 (JP) ............................. 2004-085503

(51) Int. Cl.
*G01R 33/02* (2006.01)
(52) U.S. Cl. ..................................... 324/252
(58) Field of Classification Search ................. 324/252
See application file for complete search history.

(56) References Cited

U.S. PATENT DOCUMENTS

| 5,386,642 | A | * | 2/1995 | Spies et al. ................... 33/708 |
| 5,686,837 | A | * | 11/1997 | Coehoorn et al. ........... 324/252 |
| 6,326,782 | B1 | * | 12/2001 | Schroeder .............. 324/207.21 |
| 2002/0180433 | A1 | * | 12/2002 | Van Zon et al. ............. 324/252 |

FOREIGN PATENT DOCUMENTS

| JP | 05-332703 A | 12/1993 |
| JP | 09-219548 A | 8/1997 |
| JP | 2921262 B | 4/1999 |
| JP | 2003-107142 A | 4/2003 |

OTHER PUBLICATIONS

International Search Report issued in the corresponding International Application No. PCT/JP2005/003843, mailed on Jun. 14, 2005.

* cited by examiner

*Primary Examiner*—Jay M Patidar
(74) *Attorney, Agent, or Firm*—Keating & Bennett, LLP

(57) ABSTRACT

A magnetoresistive device disposed in an elongated magnetic sensor, for example, has two parallel arrays of magnetosensitive elements arranged at regular intervals in the longitudinal direction. The magnetosensitive elements are connected in series through connection conductors, in a meandering pattern. The magnetoresistive device is disposed between two other magnetoresistive devices. The magnetoresistive devices are arranged such that the intervals between the magnetosensitive elements disposed at the ends of a magnetoresistive in the longitudinal direction and the opposed magnetosensitive elements of the magnetoresistive devices, respectively, are equal to the intervals between the magnetoresistive elements within the magnetoresistive devices.

15 Claims, 6 Drawing Sheets

D1=D2

D1>D2

D2≫D1

ELONGATED MAGNETIC SENSOR

BACKGROUND OF THE INVENTION

1. Field of the Invention

The present invention relates to elongated magnetic sensors for detecting magnetic patterns printed on, for example, currency bills.

2. Description of the Related Art

A variety of elongated magnetic sensors have been commercialized as magnetic sensors for identifying objects, such as currency bills and securities, having predetermined magnetic patterns printed thereon with, for example, magnetic ink.

The structure of a known elongated sensor is illustrated in FIGS. 7A-7C. FIG. 7A is a plan view showing the magnetosensitive portion of the sensor with a cover detached therefrom. FIG. 7B is a side view showing a long side of the sensor in that state. FIG. 7C is a side view showing a short side of the sensor in that state. In this example, an elongated magnetic sensor 200 includes a case 1' and magnetoresistive (MR) devices 21A to 21E arranged linearly in the longitudinal direction of the case 1' with no intervals therebetween. The magnetoresistive devices 21A to 21E include magnetosensitive units 22A to 22E, respectively. The magnetosensitive units 22A to 22E each include two magnetosensitive element arrays extending in the longitudinal direction. The elongated magnetic sensor 200 also includes connection electrodes 23A to 23E electrically connected to the magnetosensitive units 22A to 22E, respectively (three electrodes for each magnetosensitive unit), external connection terminals 24A to 24E disposed on the case 1' and connected to the connection electrodes 23A to 23E, respectively, and a permanent magnet (not shown) disposed on the back surface of the case 1' to apply a magnetic field to the magnetosensitive units 22A to 22E. The elongated magnetic sensor 200 senses changes in the magnetic field (changes in magnetic flux density) due to a magnetic pattern provided on an object being conveyed perpendicularly to the longitudinal direction (in the lateral direction) of the magnetosensitive elements to detect the object (see Japanese Patent No. 2921262 (Patent Document 1)).

Magnetosensitive units used for such an elongated magnetic sensor each include separate magnetosensitive elements that are combined to achieve larger changes in the resistance of magnetoresistive devices due to changes in the magnetic field, as disclosed in FIG. 4 of Japanese Unexamined Patent Application Publication No. 2003-107142 (Patent Document 2). A magnetosensitive unit shown in FIG. 4 of Patent Document 2 includes magnetosensitive elements arranged longitudinally at intervals, connection conductors electrically connecting the magnetosensitive elements, and terminal electrodes electrically connected to external connection electrodes.

FIG. 8A is an enlarged plan view of the magnetoresistive device 21C of the elongated magnetic sensor 200 shown in FIGS. 7A-7C having an inner structure shown in FIG. 4 of Patent Document 2. FIG. 8B is a partial plan view showing the arrangement of the magnetoresistive devices 21B to 21D.

In FIGS. 8A and 8B, the magnetosensitive unit 22C of the magnetoresistive device 21C includes magnetosensitive elements 221C arranged longitudinally at intervals D1, magnetosensitive elements 222C arranged in parallel with the magnetosensitive elements 221C, connection conductors 223C connecting the magnetosensitive elements 221C in series, and connection conductors 224C connecting the magnetosensitive elements 222C in series. The magnetosensitive unit 22C also includes a terminal electrode 227C electrically connected to an end of the series connection of the magnetosensitive elements 221C through a connection conductor 2251C, a terminal electrode 226C electrically connected to an end of the series connection of the magnetosensitive elements 222C through a connection conductor 2252C, and a terminal electrode 228C electrically connected to the other ends of the series connections of the magnetosensitive elements 221C and 222C through a connection conductor 2253C. The magnetoresistive device 21C is disposed between the magnetoresistive devices 21B and 21D in the longitudinal direction.

The intervals D1 between the magnetosensitive elements are adjusted so that a detection output produced when a magnetic pattern passes across the intervals D1 is substantially the same as that produced when the magnetic pattern passes across the magnetosensitive elements. However, the intervals D2 between the magnetosensitive elements nearest the contact surfaces of the adjacent magnetoresistive devices (in FIG. 8B, for example, the interval between the magnetosensitive elements of the magnetosensitive unit 22C nearest the magnetosensitive unit 22D and the magnetosensitive elements of the magnetosensitive unit 22D nearest the magnetosensitive unit 22C) are greater than the intervals D1. The magnetosensitive units cannot be extended to the ends of the magnetoresistive devices because a wafer defining a mother board for the magnetoresistive devices is separated into the magnetoresistive devices by dicing or laser cutting. That is, predetermined cutting margins are defined so as not to cut the magnetosensitive units. In addition, the connection conductors are disposed at the ends of the magnetosensitive element arrays in the longitudinal direction. Even if the magnetoresistive devices are disposed with the longitudinal ends thereof in contact with each other, the intervals between the magnetosensitive elements nearest the opposite ends of the adjacent magnetosensitive elements cannot be less than the areas used for the cutting margins and the connection conductors. When a magnetic pattern passes across the intervals D2, therefore, the elongated magnetic sensor 200 may exhibit a significant decrease in detection output and thus fail to detect the magnetic pattern.

SUMMARY OF THE INVENTION

To overcome the problems described above, preferred embodiments of the present invention provide an elongated magnetic sensor which achieves a stable detection output at any position thereof in the longitudinal direction.

An elongated magnetic sensor according to a preferred embodiment of the present invention includes magnetoresistive devices arranged in the longitudinal direction thereof, each including a magnetosensitive unit having magnetosensitive elements arranged at intervals in the longitudinal direction and connection conductors connecting the magnetosensitive elements in series. The intervals between the magnetosensitive elements disposed at the opposite ends of the adjacent magnetoresistive devices in the longitudinal direction are less than or equal to the intervals between the adjacent magnetosensitive elements within each of the magnetoresistive devices in the longitudinal direction.

When an object having a magnetic pattern provided thereon passes across a surface of the elongated magnetic sensor on which the magnetosensitive units are disposed in the lateral direction, the magnetic pattern varies a magnetic flux passing through the magnetosensitive units to change the resistance of the magnetosensitive elements. The adjacent magnetosensitive elements within each of the magnetoresistive devices are arranged in such intervals that a detection output produced when the magnetic pattern passes across the intervals is substantially equal to, or only slightly less than, a detection output produced when the magnetic pattern passes across the magnetosensitive elements. The intervals between the magnetosensitive elements nearest the opposite ends of the adjacent magnetoresistive devices are less than or equal to the intervals between the adjacent magnetosensitive elements within each of the magnetoresistive devices. Accordingly, the elongated magnetic sensor experiences very little decrease in detection output when the magnetic pattern passes across the contact portions of the adjacent magnetoresistive devices. The magnetosensitive elements may be disposed in proximity to the opposite ends of the adjacent magnetoresistive devices by providing, for example, a structure as shown in FIG. 2 in which magnetosensitive elements are located near the ends of magnetoresistive devices in the longitudinal direction, rather than by providing a structure as shown in FIG. 8A in which connection conductors are provided at the ends of magnetoresistive devices in the longitudinal direction.

Additionally, the intervals between the magnetosensitive elements disposed at the opposite ends of the adjacent magnetoresistive devices in the longitudinal direction are preferably substantially equal to the intervals between the adjacent magnetosensitive elements within each of the magnetoresistive devices in the longitudinal direction.

This structure enables the elongated magnetic sensor to produce a substantially uniform detection output in the longitudinal direction because the intervals between the magnetosensitive elements of the adjacent magnetoresistive devices in the longitudinal direction are substantially equal to the intervals between the magnetosensitive elements within each of the magnetoresistive devices in the longitudinal direction.

Additionally, the magnetosensitive unit preferably includes first and second magnetosensitive element arrays arranged substantially perpendicularly to the longitudinal direction. The magnetosensitive elements are arranged such that the locations of the magnetosensitive elements of the first magnetosensitive element array in the longitudinal direction, when viewed in the lateral direction, differ from those of the magnetosensitive elements of the second magnetosensitive element array in the longitudinal direction.

With this structure, the magnetosensitive elements are arranged in two arrays such that the locations of the magnetosensitive elements in the longitudinal direction differ between the two arrays. The intervals between the diagonally adjacent magnetosensitive elements within each of the magnetoresistive devices in the longitudinal direction are less than where the magnetosensitive elements of the two arrays are arranged at the same locations in the longitudinal direction. The intervals between the diagonally adjacent magnetosensitive elements disposed at the opposite ends of the adjacent magnetoresistive devices in the longitudinal direction are reduced according to the intervals between the adjacent magnetosensitive elements within each of the magnetoresistive devices. This reduces the area that is not covered by the magnetosensitive elements in the longitudinal direction so as to further stabilize the detection output.

Additionally, the connection conductors are preferably not disposed at the ends of the magnetoresistive devices in the longitudinal direction.

In a known structure, each magnetoresistive device includes conductors provided at the ends thereof in the longitudinal direction to connect a magnetosensitive unit to terminal electrodes adjacent to either long side of the magnetoresistive device and to connect magnetosensitive elements to each other. In contrast, in the structure described above, each magnetoresistive device includes no connection conductors at the ends thereof because terminal electrodes are disposed adjacent to both sides of the magnetoresistive device in the longitudinal direction. As a result, the magnetosensitive elements are provided in regions where connection conductors would be provided in the known structure to minimize the intervals between the magnetosensitive elements disposed at the opposite ends of the magnetoresistive devices. Accordingly, the overall pitch of the magnetosensitive elements is reduced to stabilize the detection output.

According to preferred embodiments of the present invention, the intervals between the magnetosensitive elements nearest the opposite ends of the adjacent magnetoresistive devices are less than or equal to the intervals between the adjacent magnetosensitive elements within each of the magnetoresistive devices. The elongated magnetic sensor does not exhibit a substantial decrease in detection output when a magnetic pattern passes across any region of the elongated magnetic sensor in the longitudinal direction. The elongated magnetic sensor therefore stably and reliably detects a magnetic pattern on an object being conveyed in the lateral direction.

Additionally, according to various preferred embodiments of the present invention, the magnetosensitive elements are preferably arranged in two arrays such that the locations of the magnetosensitive elements in the longitudinal direction differ between the two arrays. The elongated magnetic sensor therefore produces a more stable detection output in the longitudinal direction with reduced intervals between the adjacent magnetosensitive elements in the longitudinal direction.

Additionally, according to various preferred embodiments of the present invention, the connection conductors are not provided at the ends of the magnetoresistive devices in the longitudinal direction. As a result, the intervals between the magnetosensitive elements located at the opposite ends of the magnetoresistive devices are reduced such that the elongated magnetic sensor produces a more stable detection output.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

An elongated magnetic sensor according to a first preferred embodiment of the present invention will now be described with reference to FIGS. 1A-2B.

Figure 1A:
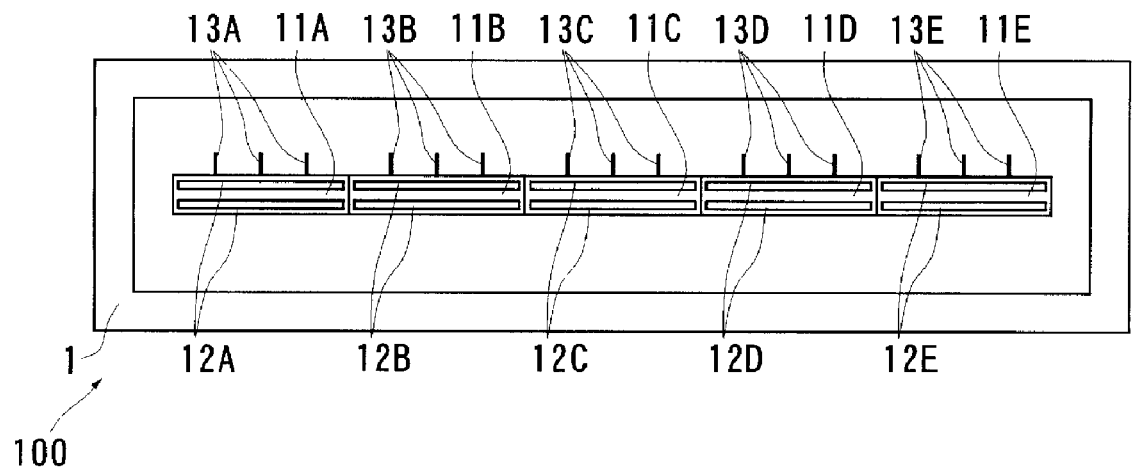
FIGS. 1A-1C show a perspective view, a plan view, and a side view of an elongated magnetic sensor according to a first preferred embodiment of the present invention.
Figure 1B:
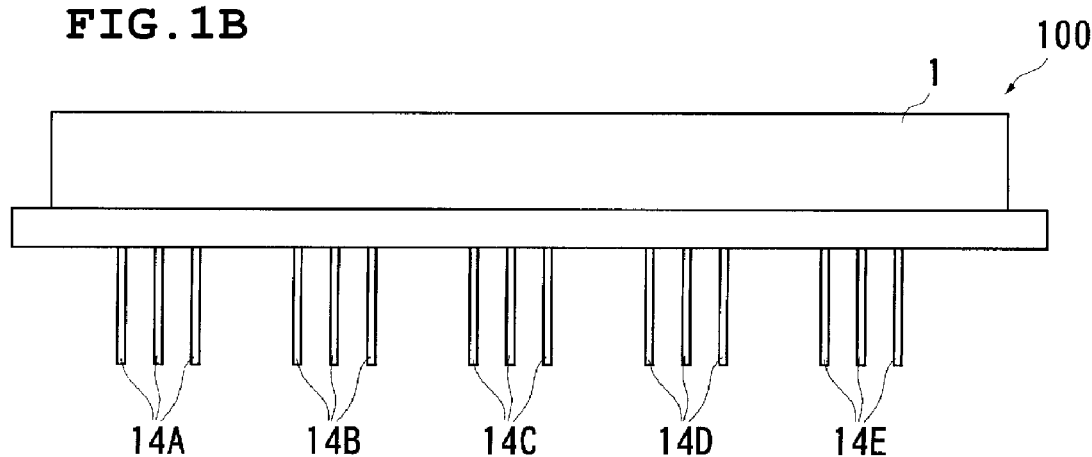
Figure 1C:
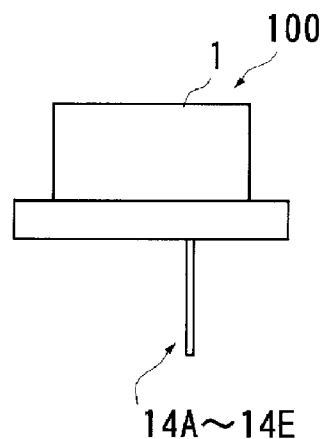

FIG. 1A is a plan view of the elongated magnetic sensor according to this preferred embodiment. FIG. 1B is a side view showing a long side of the elongated magnetic sensor. FIG. 1C is a side view showing a short side of the elongated magnetic sensor. These drawings illustrate the elongated magnetic sensor with a cover for covering a surface on which magnetoresistive devices are arranged being detached therefrom.

In FIGS. 1A-1C, an elongated magnetic sensor 100 includes a case 1 and magnetoresistive (MR) devices 11A to 11E arranged linearly in the longitudinal direction of the case 1. The magnetoresistive devices 11A to 11E include magnetosensitive units 12A to 12E, respectively, with the longitudinal direction thereof being parallel with that of the magnetoresistive devices 11A to 11E. The elongated magnetic sensor 100 also includes connection electrodes 13A to 13E extending from ends of the magnetoresistive devices 11A to 11E, respectively, in the lateral direction thereof (three electrodes for each magnetoresistive device) and external connection terminals 14A to 14E protruding from the back surface of the case 1 (opposite the surface on which the magnetoresistive devices 11A to 11E are provided) and having a predetermined length (three terminals for each magnetoresistive device). The connection electrodes 13A to 13E and the external connection terminals 14A to 14E are arranged in the longitudinal direction. The connection electrodes 13A to 13E are electrically connected to the external connection terminals 14A to 14E, respectively; for example, the three connection electrodes 13A are connected to the three corresponding external connection terminals 14A. A groove (not shown) is provided in a region on the back surface of the case 1 opposite the magnetoresistive devices 11A to 11E. A permanent magnet (not shown) is disposed in the groove to apply a predetermined magnetic field to the magnetosensitive units 12A to 12E.

The structure of the magnetoresistive devices 11A to 11E is now described with reference to FIGS. 2A and 2B. The magnetoresistive device 11c is herein described as an example because the magnetoresistive devices 11A to 11E preferably have the same structure.

Figure 2A:
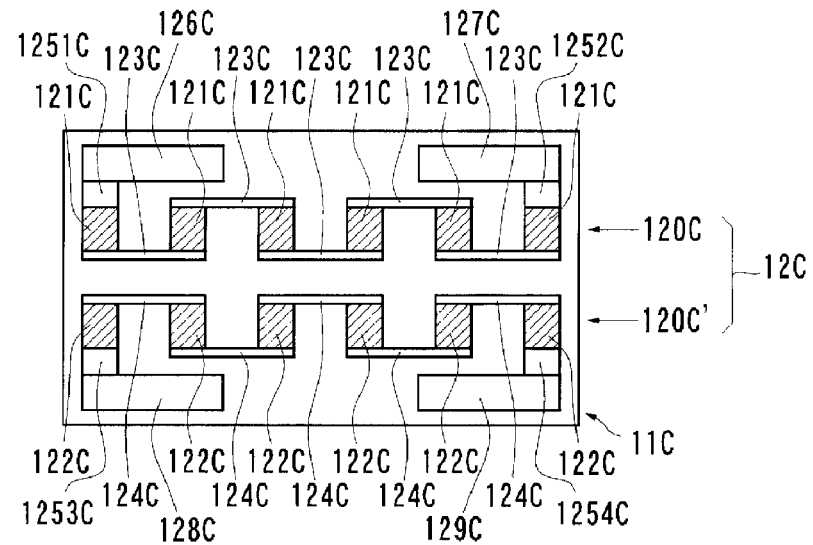
FIGS. 2A and 2B show an enlarged plan view of a magnetoresistive device 11C of the elongated magnetic sensor shown in FIGS. 1A-1C and a partial plan view showing the arrangement of magnetoresistive devices 11B to 11D.

FIG. 2A is an enlarged plan view of the magnetoresistive device 11C of the elongated magnetic sensor 100 shown in FIGS. 1A-1C. FIG. 2B is a partial plan view showing the arrangement of the magnetoresistive devices 11B to 11D.

Figure 2B:
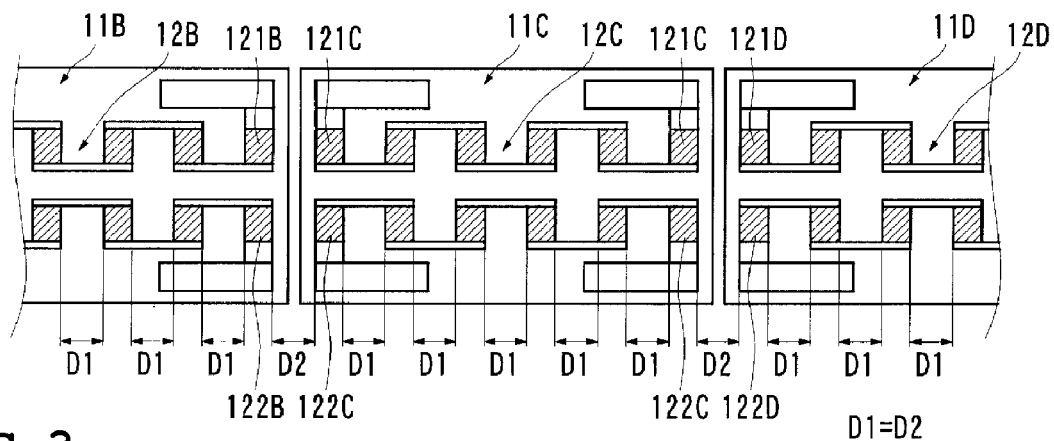

In FIGS. 2A and 2B, the magnetoresistive device 11C includes magnetosensitive elements 121C and 122C arranged longitudinally at the same intervals D1. The locations of the magnetosensitive elements 121C and 122C are different in the lateral direction but are aligned in the longitudinal direction. The adjacent magnetosensitive elements 121C are connected in series through connection conductors 123C. The magnetosensitive elements 121C are connected in a meandering pattern with the intervals therebetween to define a first magnetosensitive element array 120C. The magnetosensitive elements 121C at the ends of the magnetoresistive device 11C in the longitudinal direction are electrically connected to terminal electrodes 126C and 127C through connection electrodes 1251C and 1252C, respectively. The terminal electrodes 126C and 127C are disposed outside the first magnetosensitive element array 120C in the lateral direction (on the top side thereof in FIGS. 2A and 2B). The terminal electrode 126C is connected to one of the outer connection terminals 13C while the terminal electrode 127C is connected to the inner connection terminal 13C.

The adjacent magnetosensitive elements 122C are connected in series through connection conductors 124C. The magnetosensitive elements 122C are connected in a meandering pattern with the intervals therebetween to define a second magnetosensitive element array 120C'. The magnetosensitive elements 122C at the ends of the magnetoresistive device 11C in the longitudinal direction are electrically connected to terminal electrodes 128C and 129C through connection electrodes 1253C and 1253C, respectively. The terminal electrodes 128C and 129C are disposed outside the second magnetosensitive element array 120C' in the lateral direction (on the bottom side thereof in FIGS. 2A and 2B), that is, on the side opposite the terminal electrodes 126C and 127C. The terminal electrode 128C is connected to the inner connection terminal 13C while the terminal electrode 129C is connected to the other outer connection terminal 13C.

The outermost magnetosensitive elements 121C of the first magnetosensitive element array 120C and the outermost magnetosensitive elements 122C of the second magnetosensitive element array 120C' are disposed in the vicinities of the ends of the magnetoresistive device 11C in the longitudinal direction. Specifically, the outermost magnetosensitive elements of the magnetosensitive element arrays are disposed in the vicinities of the ends of the magnetoresistive device 11C in the longitudinal direction with consideration given to the cutting accuracy with which a wafer is cut into the magnetoresistive devices. As a result, the intervals between the magnetosensitive elements disposed at the opposite ends of the adjacent magnetoresistive devices are less than in conventional devices, that is, in the case where connection conductors are provided at the ends of magnetoresistive devices in the longitudinal direction.

The magnetoresistive devices 11A to 11E are arranged in the longitudinal direction of the case 1 such that the intervals D2 between the opposite magnetosensitive elements of the adjacent magnetoresistive devices (in FIG. 2B, the interval between the magnetosensitive element 121B of the magnetoresistive device 11B and the magnetosensitive element 121C of the magnetoresistive device 11C and the interval between the magnetosensitive element 121C of the magnetoresistive device 11C and the magnetosensitive element 121D of the magnetoresistive device 11D) correspond to the intervals D1 between the magnetosensitive elements within each magnetoresistive device (e.g., the magnetoresistive device 11C). Accordingly, the magnetosensitive elements of the magnetoresistive devices 11A to 11E are arranged at the same intervals D1 (=D2) in the longitudinal direction.

The operation of the elongated magnetic sensor 100 is described below.

As an object having a magnetic pattern printed thereon, such as a currency bill, is conveyed in the lateral direction of the elongated magnetic sensor 100, the magnetic pattern passes near the surface of the elongated magnetic sensor 100 on the magnetoresistive device side. The magnetic pattern on the object then varies the magnetic field of the permanent magnet to change the density of the magnetic flux passing through the magnetosensitive elements located in the region where the magnetic pattern passes. The resistance of the magnetosensitive elements changes in response to the change in the flux density. The elongated magnetic sensor 100 senses the change in resistance to detect the magnetic pattern. For example, the external connection terminals 14A to 14C are connected to positive voltage terminals, grounding terminals, and negative voltage terminals such that the elongated magnetic sensor 100 senses the change in the resistance of the magnetosensitive elements according to the change in the current passing through the terminals to detect the magnetic pattern.

In the structure described above, all magnetosensitive elements are disposed at regular intervals across the ends of the magnetoresistive devices 11A to 11E to produce a substantially constant detection output irrespective of where the magnetic pattern passes in the longitudinal direction of the elongated magnetic sensor 100. That is, the elongated magnetic sensor 100 does not suffer from problems in the known art, including a significant decrease in detection output resulting between magnetoresistive devices and a time difference in detection output between magnetoresistive devices.

Accordingly, an elongated magnetic sensor is provided which stably and reliably detects a magnetic pattern irrespective of, for example, where the magnetic pattern is disposed on an object.

Next, an elongated magnetic sensor according to a second preferred embodiment of the present invention will be described with reference to FIG. 3.

Figure 3:
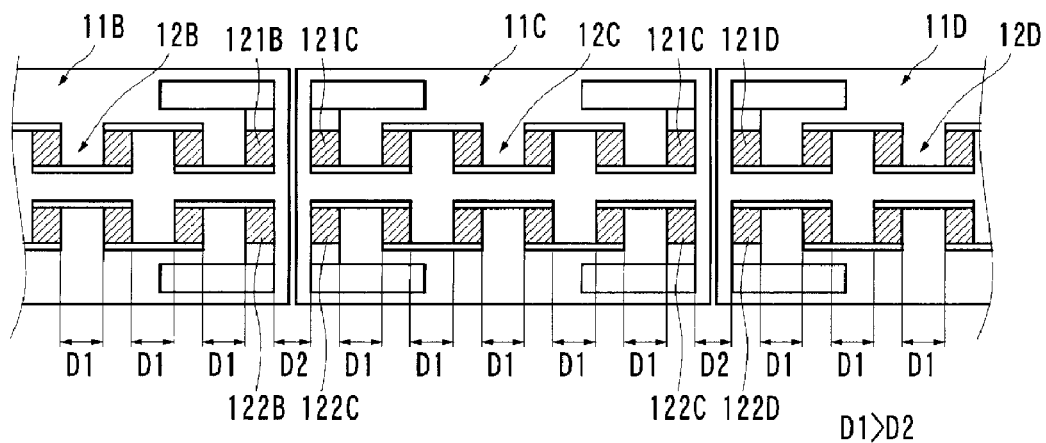
FIG. 3 is a partial plan view showing the arrangement of magnetoresistive devices 11B to 11D of an elongated magnetic sensor according to a second preferred embodiment of the present invention.

FIG. 3 is a partial plan view showing the arrangement of the magnetoresistive devices 11B to 11D of the elongated magnetic sensor according to this preferred embodiment.

For the elongated magnetic sensor shown in FIG. 3, the intervals D2 between the opposite magnetosensitive elements of the adjacent magnetoresistive devices are less than the intervals D1 between the magnetosensitive elements within each magnetoresistive device. The rest of the structure is the same as the elongated magnetic sensor according to the first preferred embodiment of the present invention.

This structure prevents a decrease in the detection output produced when a magnetic pattern passes between the opposite ends of the adjacent magnetoresistive devices relative to that produced when the magnetic pattern passes across the magnetoresistive devices. If the intervals D2 are much less than the intervals D1, a larger detection output is produced when a magnetic pattern passes across the intervals D2, that is, between the adjacent magnetoresistive devices, than when the magnetic pattern passes across the magnetoresistive devices. In that case, the magnetic pattern may be detected by controlling the detection output produced in the intervals D2. Therefore, the elongated magnetic sensor reliably detects the magnetic pattern.

In the structure according to this preferred embodiment, the intervals D2 between the opposite magnetosensitive elements of the adjacent magnetoresistive devices are less than the intervals D1 between the magnetosensitive elements within each magnetoresistive device. Unlike the first preferred embodiment, the intervals D2 do not necessarily have to correspond to the intervals D1, such that the magnetoresistive devices can be easily arranged. While regular intervals, as in the first preferred embodiment, may be difficult to precisely define between magnetoresistive devices in actual manufacturing processes, the structure according to the second preferred embodiment can be relatively easily achieved because slight errors such as intervals D1 that are greater than intervals D2 are permissible. The second preferred embodiment can therefore provide a higher yield of elongated magnetic sensors than the first preferred embodiment.

That is, the second preferred embodiment allows the production of elongated magnetic sensors without decreasing the yield thereof due to an error associated with an arrangement step in manufacturing processes.

Next, an elongated magnetic sensor according to a third preferred embodiment of the present invention will be described with reference to FIGS. 4A and 4B.

Figure 4A:
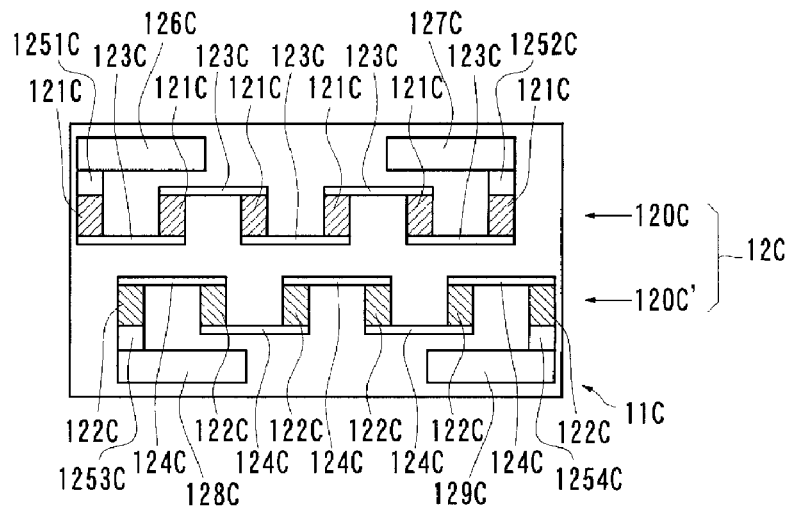
FIGS. 4A and 4B show an enlarged plan view of a magnetoresistive device 11C of an elongated magnetic sensor according to a third preferred embodiment of the present invention and a partial plan view showing the arrangement of magnetoresistive devices 11B to 11D.

FIG. 4A is an enlarged plan view of the magnetoresistive device 11C of the elongated magnetic sensor according to this preferred embodiment of the present invention.

Figure 4B:
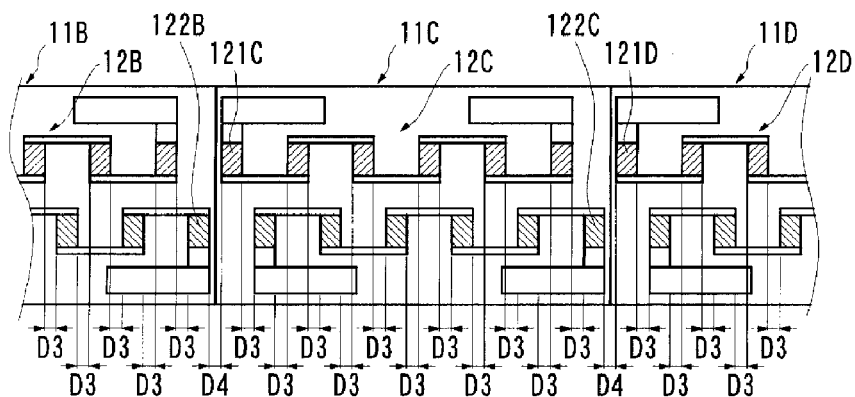

FIG. 4B is a partial plan view showing the arrangement of the magnetoresistive devices 11B to 11D.

For the magnetoresistive device 11C of the elongated magnetic sensor according to this preferred embodiment, as shown in FIGS. 4A and 4B, the locations of the magnetosensitive elements 121C of the first magnetosensitive element array 120C are different in the longitudinal direction from those of the magnetosensitive elements 122C of the second magnetosensitive element array 120C'. Specifically, the magnetosensitive elements 122C are disposed at locations corresponding to the centers between the adjacent magnetosensitive elements 121C. The magnetosensitive elements 121C and 122C, which are diagonally adjacent with respect to the longitudinal direction, are arranged at intervals D3 in the longitudinal direction. The intervals D3 are less than the intervals D1 in the first and second preferred embodiments. The diagonally opposed magnetosensitive elements of the adjacent magnetoresistive devices (e.g., the diagonally opposed magnetosensitive elements 122B and 121C of the magnetoresistive device 11B and 11C and the diagonally opposed magnetosensitive elements 122C and 121D of the magnetoresistive device 11C and 11D) are arranged at intervals D4 equal to the intervals D3. The remainder of the structure is the same as the elongated magnetic sensor according to the first preferred embodiment of the present invention.

The elongated magnetic sensor having the structure described above reliably detects a magnetic pattern irrespective of where the magnetic pattern passes, as in the first preferred embodiment of the present invention. In addition, the elongated magnetic sensor produces a more stable detection output because the intervals between the magnetosensitive elements in the longitudinal direction are less than those in the first preferred embodiment, and thus, the area that is not covered by the magnetosensitive elements is reduced in the longitudinal direction.

Next, an elongated magnetic sensor according to a fourth preferred embodiment will be described with reference to FIG. 5.

Figure 5:
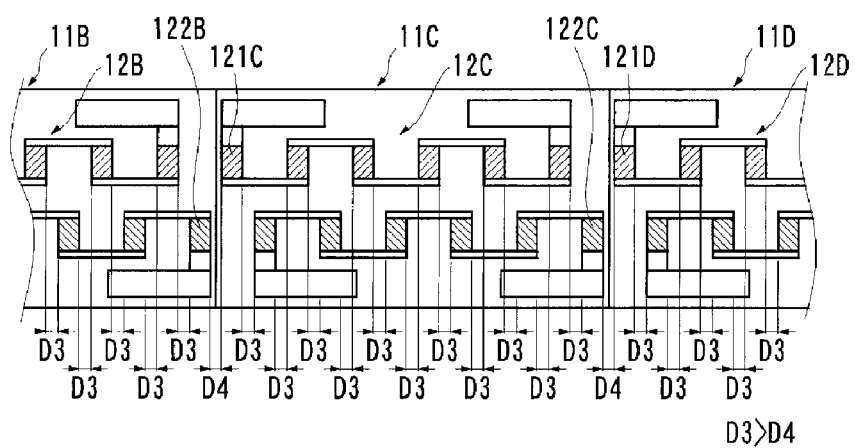
FIG. 5 is a partial plan view showing the arrangement of magnetoresistive devices 11B to 11D of an elongated magnetic sensor according to a fourth preferred embodiment of the present invention.

FIG. 5 is a partial plan view showing the arrangement of the magnetoresistive devices 11B to 11D of the elongated magnetic sensor according to this preferred embodiment of the present invention.

For the elongated magnetic sensor according to this preferred embodiment, as shown in FIG. 5, the intervals D4 between the diagonally opposed magnetosensitive elements of the adjacent magnetoresistive devices are less than the intervals D3 between the diagonally adjacent magnetosensitive elements within each magnetoresistive device. The remainder of the structure is the same as the elongated magnetic sensor according to the third preferred embodiment of the present invention.

The elongated magnetic sensor having the structure described above has the same advantages as in the third preferred embodiment and can be produced without decreasing yield due to an error associated with manufacturing processes, as in the second preferred embodiment of the present invention.

Although the magnetosensitive units are arranged in a meandering pattern in the preferred embodiments described above, they may also be arranged in a linear pattern in the longitudinal direction, as shown in FIG. 6.

Figure 6A:
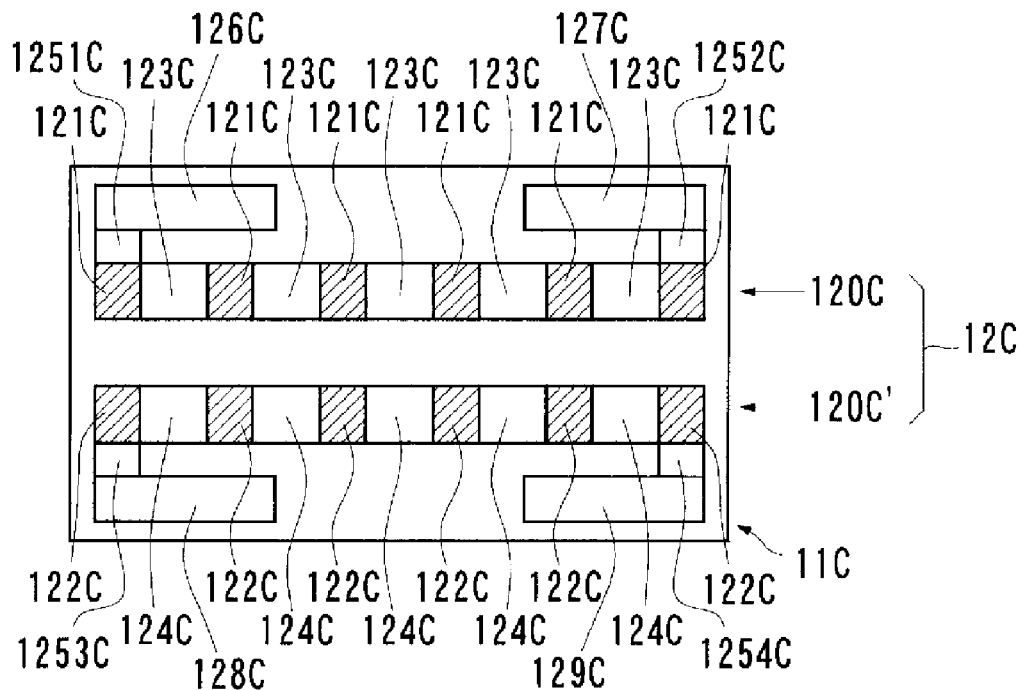
FIGS. 6A and 6B show an enlarged plan view of a magnetoresistive device 11C of an elongated magnetic sensor according to another embodiment and a partial plan view showing the arrangement of magnetoresistive devices 11B to 11D.
Figure 6B:
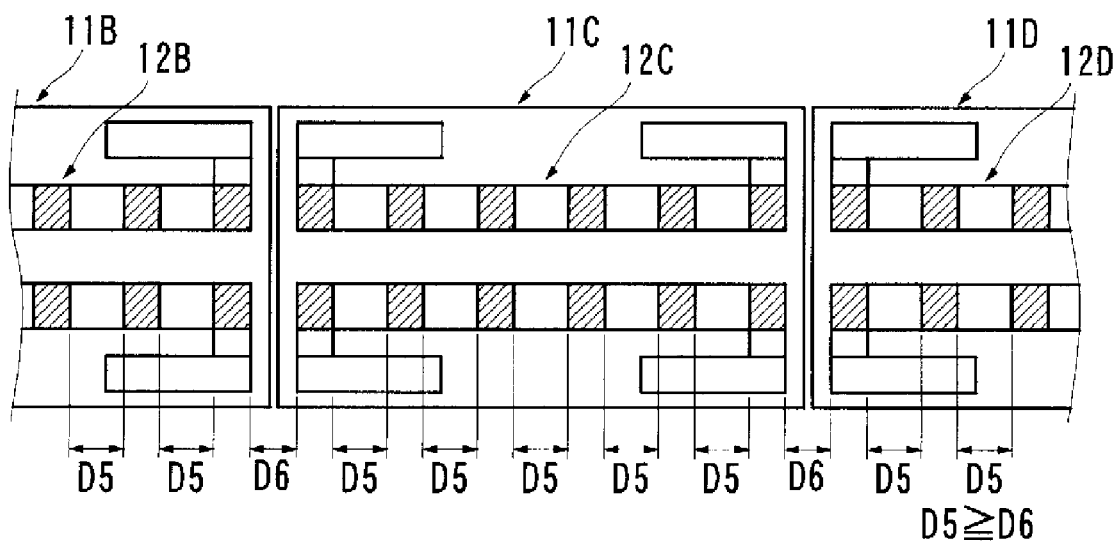
Figure 7A:
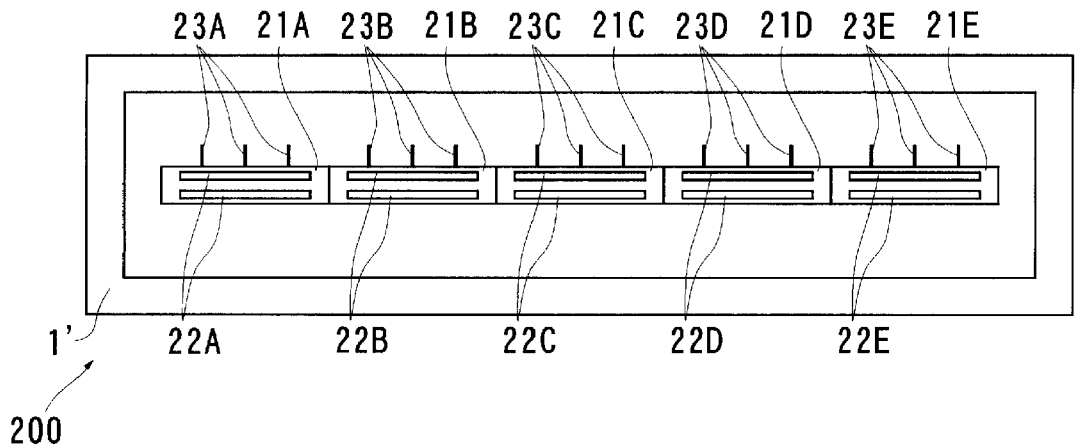
FIGS. 7A-7C show a plan view and side views of a known elongated magnetic sensor.
Figure 7B:
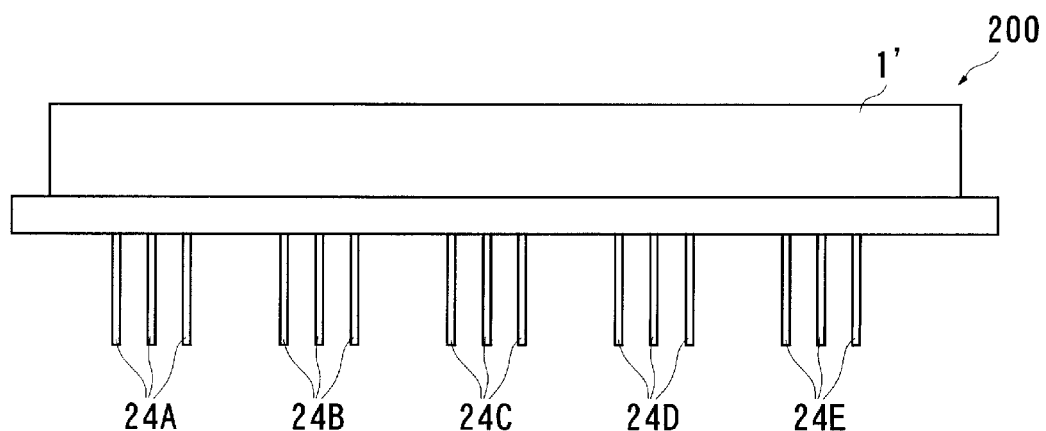
Figure 7C:
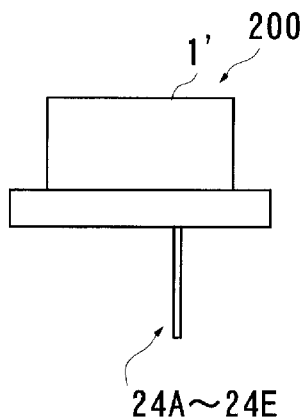
Figure 8A:
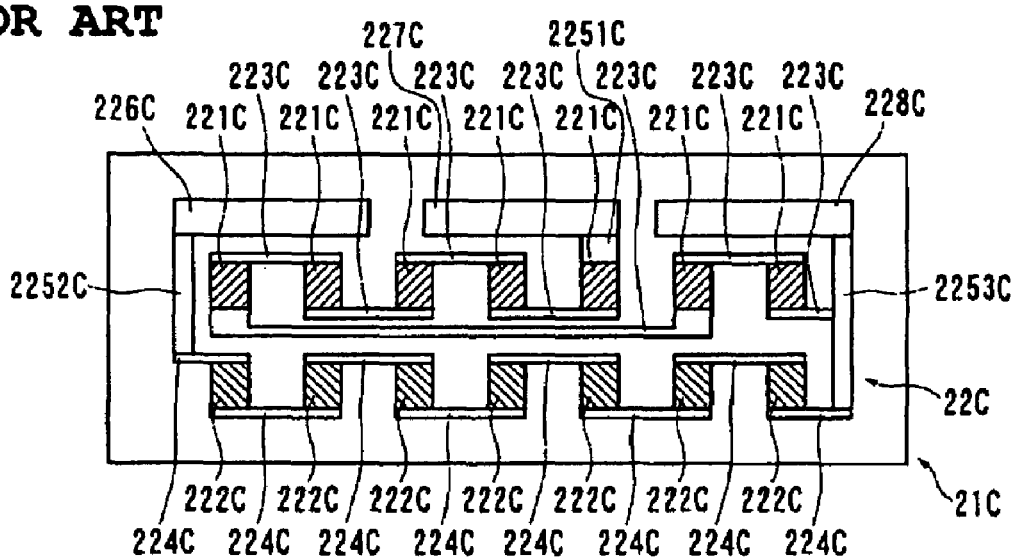
FIGS. 8A and 8B show an enlarged plan view of a magnetoresistive device 21C shown in FIG. 7A and a partial plan view showing the arrangement of magnetoresistive devices 21B to 21D.
Figure 8B:
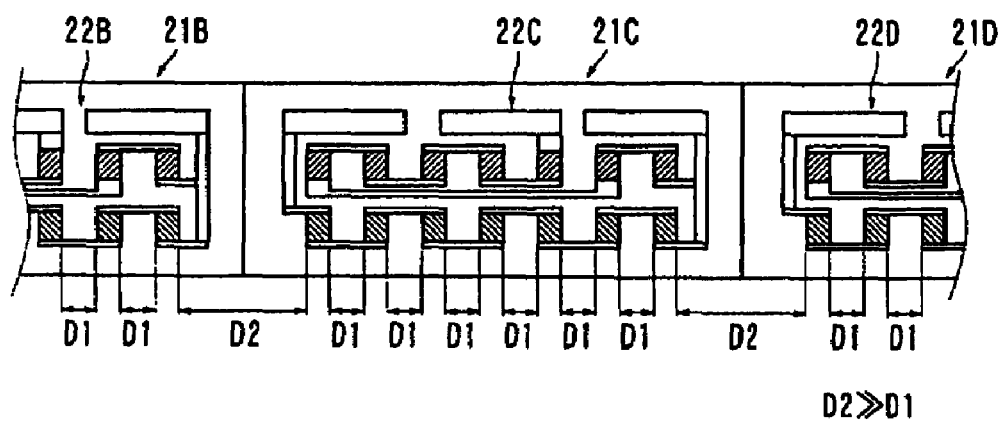

FIGS. 6A and 6B shows enlarged plan views of an elongated magnetic sensor in which the magnetosensitive element arrays 120C and 120C' of the magnetosensitive units are arranged in a linear pattern. FIG. 6A is an enlarged plan view of the magnetoresistive device 11C. FIG. 6B is a partial plan view showing the arrangement of the magnetoresistive devices 11B to 11D.

For the elongated magnetic sensor, the magnetosensitive unit 12C includes the first magnetosensitive element array 120C, in which the magnetosensitive elements 121C and the connection conductors 123C are alternately connected in the longitudinal direction, and the second magnetosensitive element array 120C', in which the magnetosensitive elements 122C and the connection conductors 124C are alternately connected in the longitudinal direction. The intervals D6 between the opposed magnetosensitive elements of the adjacent magnetoresistive devices are less than or equal to the intervals D5 between the magnetosensitive elements within each magnetoresistive device. The remainder of the structure is the same as the elongated magnetic sensor according to the first preferred embodiment of the present invention.

This structure has the advantage of stably and reliably detecting a magnetic pattern irrespective of where the magnetic pattern passes, as in the first and second preferred embodiments of the present invention.

The positions of the magnetosensitive elements in the longitudinal direction may differ between the two parallel magnetosensitive element arrays, as in the third and fourth preferred embodiments. Such a structure has the advantage of more stably detecting a magnetic pattern, as in the third and fourth preferred embodiments of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An elongated magnetic sensor comprising:
   magnetoresistive devices arranged in a longitudinal direction thereof, each including a magnetosensitive unit having magnetosensitive elements arranged at intervals in the longitudinal direction and connection conductors connecting the magnetosensitive elements in series; wherein
   intervals between the magnetosensitive elements disposed at opposite ends of adjacent magnetoresistive devices in a longitudinal direction are less than or equal to intervals between adjacent magnetosensitive elements within each of the magnetoresistive devices in the longitudinal direction.

2. The elongated magnetic sensor according to claim 1, wherein the intervals between the magnetosensitive elements disposed at the opposite ends of the adjacent magnetoresistive devices in the longitudinal direction are substantially equal to the intervals between the adjacent magnetosensitive elements within each of the magnetoresistive devices in the longitudinal direction.

3. The elongated magnetic sensor according to claim 1, wherein
   the magnetosensitive unit includes first and second magnetosensitive element arrays arranged substantially perpendicularly to the longitudinal direction; and
   the magnetosensitive elements are arranged such that locations of the magnetosensitive elements of the first magnetosensitive element array in the longitudinal direction, when viewed in a lateral direction, differ from locations of the magnetosensitive elements of the second magnetosensitive element array in the longitudinal direction.

4. The elongated magnetic sensor according to claim 1, wherein the connection conductors are not disposed at the ends of the magnetoresistive devices in the longitudinal direction.

5. The elongated magnetic sensor according to claim 1, wherein the magnetosensitive elements are connected in series through the connection conductors in a meandering pattern.

6. The elongated magnetic sensor according to claim 1, wherein the magnetosensitive elements are connected in series through the connection conductors in a linear pattern.

7. The elongated magnetic sensor according to claim 1, wherein the intervals between the magnetosensitive elements disposed at opposite ends of adjacent magnetoresistive devices in the longitudinal direction are less than the intervals between adjacent magnetosensitive elements within each of the magnetoresistive devices in the longitudinal direction.

8. An elongated magnetic sensor comprising:
   a plurality of magnetoresistive devices arranged in a longitudinal direction thereof;
   each of said plurality of magnetoresistive devices including a magnetosensitive unit having magnetosensitive elements arranged at intervals in the longitudinal direction and connected in series; wherein
   intervals between the magnetosensitive elements disposed at opposite ends of adjacent ones of the plurality of magnetoresistive devices in the longitudinal direction are less than or equal to intervals between adjacent magnetosensitive elements within each of the plurality of magnetoresistive devices in the longitudinal direction.

9. The elongated magnetic sensor according to claim 8, wherein the magnetosensitive elements of each of the plurality of magnetoresistive devices are connected in series via connection conductors.

10. The elongated magnetic sensor according to claim 9, wherein the connection conductors are not disposed at the ends of the magnetoresistive devices in the longitudinal direction.

11. The elongated magnetic sensor according to claim 9, wherein the magnetosensitive elements are connected in series through the connection conductors in a meandering pattern.

12. The elongated magnetic sensor according to claim 9, wherein the magnetosensitive elements are connected in series through the connection conductors in a linear pattern.

13. The elongated magnetic sensor according to claim 8, wherein the intervals between the magnetosensitive elements disposed at the opposite ends of the adjacent magnetoresistive devices in the longitudinal direction are substantially equal to the intervals between the adjacent magnetosensitive elements within each of the magnetoresistive devices in the longitudinal direction.

14. The elongated magnetic sensor according to claim 8, wherein the magnetosensitive unit includes first and second magnetosensitive element arrays arranged substantially perpendicularly to the longitudinal direction; and the magnetosensitive elements are arranged such that locations of the magnetosensitive elements of the first magnetosensitive element array in the longitudinal direction, when viewed in a lateral direction, differ from locations of the magnetosensitive elements of the second magnetosensitive element array in the longitudinal direction.

15. The elongated magnetic sensor according to claim 8, wherein the intervals between the magnetosensitive elements disposed at opposite ends of adjacent magnetoresistive devices in the longitudinal direction are less than the intervals between adjacent magnetosensitive elements within each of the magnetoresistive devices in the longitudinal direction.

* * * * *

UNITED STATES PATENT AND TRADEMARK OFFICE
CERTIFICATE OF CORRECTION

PATENT NO. : 7,589,527 B2  Page 1 of 1
APPLICATION NO. : 10/595407
DATED : September 15, 2009
INVENTOR(S) : Minamitani et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 747 days.

Signed and Sealed this

Twenty-first Day of September, 2010

David J. Kappos
*Director of the United States Patent and Trademark Office*